(12) United States Patent
Bolotnikov et al.

(10) Patent No.: US 12,396,187 B2
(45) Date of Patent: Aug. 19, 2025

(54) DIODES WITH SCHOTTKY CONTACT INCLUDING LOCALIZED SURFACE REGIONS

(71) Applicant: SEMICONDUCTOR COMPONENTS INDUSTRIES, LLC, Phoenix, AZ (US)

(72) Inventors: Alexander Viktorovich Bolotnikov, Niskayuna, NY (US); Fredrik Allerstam, Solna (SE)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 484 days.

(21) Appl. No.: 17/811,618

(22) Filed: Jul. 11, 2022

(65) Prior Publication Data

US 2024/0014328 A1 Jan. 11, 2024

(51) Int. Cl.
*H10D 8/60* (2025.01)
*H10D 62/10* (2025.01)
*H10D 62/832* (2025.01)

(52) U.S. Cl.
CPC ............. *H10D 8/60* (2025.01); *H10D 62/109* (2025.01); *H10D 62/8325* (2025.01)

(58) Field of Classification Search
CPC ................................. H10D 8/051; H10D 8/60
(Continued)

(56) References Cited

U.S. PATENT DOCUMENTS 9,929,284 B1 3/2018 Zhang et al.
2015/0144966 A1* 5/2015 Konrath ............ H01L 29/66143
257/77
(Continued)

FOREIGN PATENT DOCUMENTS

JP 05259436 A 8/1993
JP 2004266115 A 9/2004
(Continued)

OTHER PUBLICATIONS

Search Report for counterpart International Application No. PCT/US2023/068398, mailed Feb. 7, 2024, 23 pages.
(Continued)

*Primary Examiner* — Fazli Erdem
(74) *Attorney, Agent, or Firm* — Brake Hughes Bellermann LLP

(57) ABSTRACT

In some aspects, the techniques described herein relate to a diode including: a substrate of a first conductivity type; a semiconductor layer of the first conductivity type disposed on the substrate, the semiconductor layer including a drift region; a shield region of a second conductivity type disposed in the semiconductor layer adjacent to the drift region; a surface region of the first conductivity type disposed in a first portion of the drift region adjacent to the shield region, the surface region having a doping concentration that is greater than a doping concentration of a second portion of the drift region adjacent to the surface region, the second portion of the drift region excluding the surface region; and a Schottky material disposed on: at least a portion of the shield region; the surface region in the first portion of the drift region; and the second portion of the drift region.

20 Claims, 7 Drawing Sheets

(58) Field of Classification Search
USPC .......................................................... 257/409
See application file for complete search history.

(56) References Cited

U.S. PATENT DOCUMENTS

| | | |
|---|---|---|
| 2016/0211387 A1 | 7/2016 | Zhang |
| 2018/0358478 A1 | 12/2018 | Ren et al. |
| 2020/0194584 A1 | 6/2020 | Lichtenwalner et al. |
| 2022/0020884 A1* | 1/2022 | Rascun ............... H01L 29/8611 |

FOREIGN PATENT DOCUMENTS

| | | |
|---|---|---|
| JP | 2012124268 A | 6/2012 |
| JP | 2015207780 A | 11/2015 |
| WO | 2019224237 A1 | 11/2019 |

OTHER PUBLICATIONS

T. Hariu et al., "Control of Schottky Barrier Height by Thin High-Doped Layer," Proceedings of the IEEE, Oct. 1975.
The Partial Search Report for International Application No. PCT/US2023/068398, dated Oct. 18, 2023, 14 pages.

\* cited by examiner

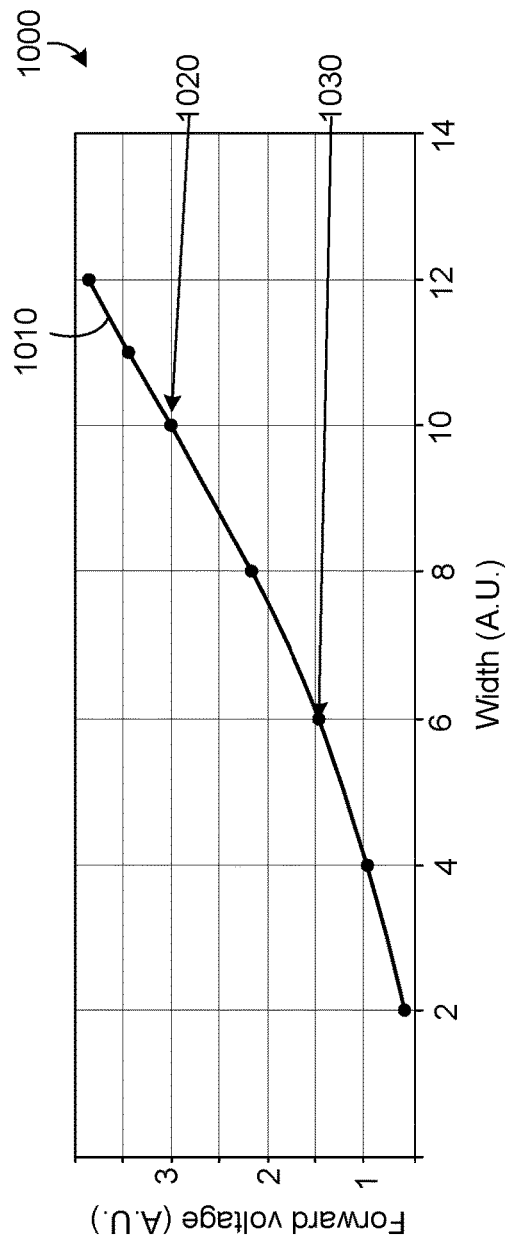
FIG. 10
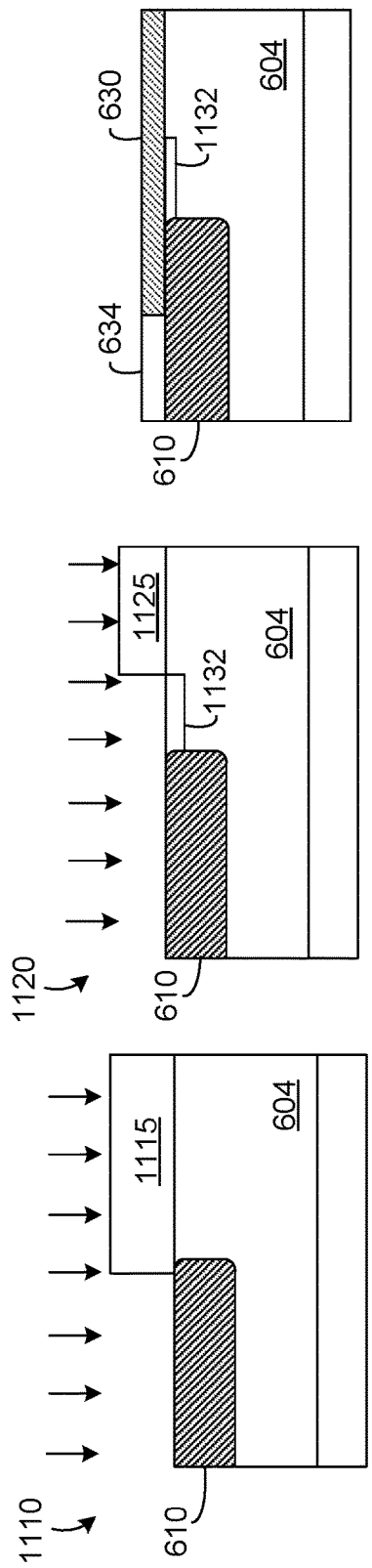
FIG. 11A
FIG. 11B
FIG. 11C

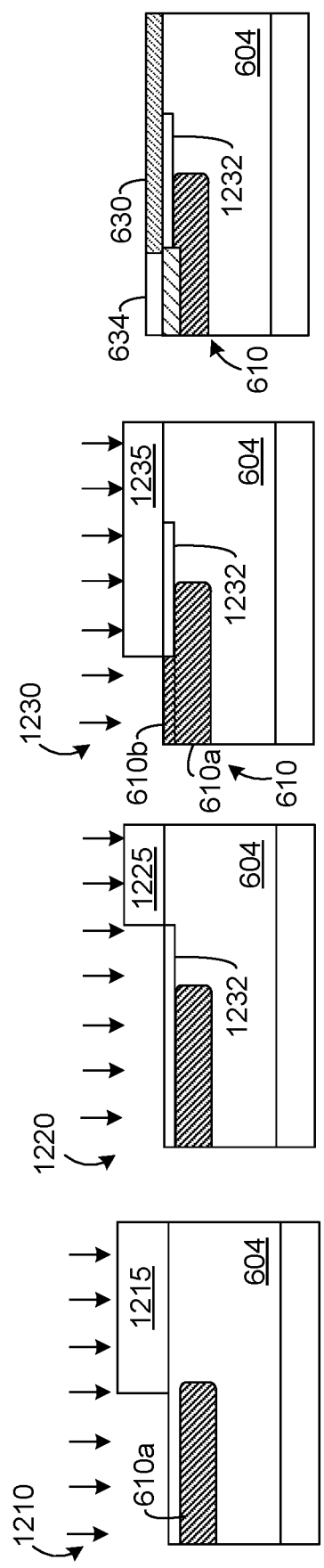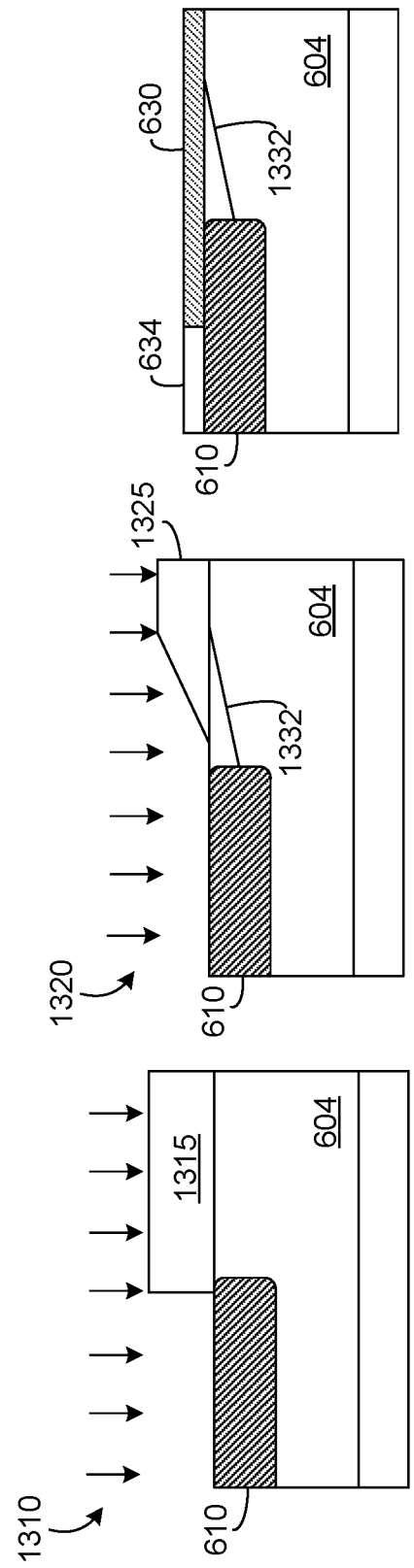

US 12,396,187 B2

DIODES WITH SCHOTTKY CONTACT INCLUDING LOCALIZED SURFACE REGIONS

TECHNICAL FIELD

This description relates to Schottky diodes that include shallow regions to locally modify barrier height and electric field, such as under a Schottky contact in the diode's drift region, to improve the diode's operating characteristics.

BACKGROUND

Semiconductor materials, e.g., silicon (Si) silicon carbide (SiC), gallium nitride (GaN), etc., used to produce high-power semiconductor devices are subject to the presence of high electric fields during operation of associated semiconductor devices, which can operate at 400 volts (V), 600 V, 1200 V, or higher. Schottky diodes utilizing such a power semiconductor materials (e.g., SiC), due to such high electric fields under reverse-biased conditions, can experience leakage currents that approach, or exceed acceptable operating limits. This is due, in part, to the fact that there is a tradeoff between forward-operating characteristics of a Schottky diode, and its reverse-bias leakage current. That is, improving forward-operating characteristics of a Schottky diode, such as reducing conduction losses by reducing forward voltage drop ($V_f$), results in an increase in leakage current of the diode. Accordingly, in current approaches, in order to reduce on-state conduction losses (e.g., reduce $V_f$), designers must sacrifice a diode's reverse characteristics, which can result in leakage currents exceeding acceptable values. Conversely in previous approaches, in order to improve a diode's reverse characteristic (e.g., reduce leakage), designers must sacrifice a diode's forward operating characteristics.

SUMMARY

In some aspects, the techniques described herein relate to a diode including: a substrate of a first conductivity type; a semiconductor layer of the first conductivity type disposed on the substrate, the semiconductor layer including a drift region of the diode; a shield region of a second conductivity type disposed in the semiconductor layer adjacent to the drift region; a surface region of the first conductivity type disposed in a first portion of the drift region adjacent to the shield region, the surface region having a doping concentration that is greater than a doping concentration of a second portion of the drift region adjacent to the surface region, the second portion of the drift region excluding the surface region; and a Schottky material disposed on: at least a portion of the shield region; the surface region in the first portion of the drift region; and the second portion of the drift region.

In some aspects, the techniques described herein relate to a diode, wherein the surface region is disposed between the shield region and the second portion of the drift region.

In some aspects, the techniques described herein relate to a diode, wherein the surface region is a first surface region, the diode further including: a second surface region of the first conductivity type disposed in a third portion of the drift region, the second surface region being disposed adjacent to the first surface region, the second surface region having a doping concentration that is greater than the doping concentration of the second portion of the drift region and less than the doping concentration of the first surface region, the Schottky material being further disposed on the second surface region.

In some aspects, the techniques described herein relate to a diode, wherein the second surface region is further disposed between the first surface region and the second portion of the drift region.

In some aspects, the techniques described herein relate to a diode, wherein: the semiconductor layer includes a mesa having a height, the mesa being defined by trenches formed in the semiconductor layer; the surface region being disposed in an upper portion of the mesa; and the Schottky material being disposed on the mesa.

In some aspects, the techniques described herein relate to a diode, wherein the surface region is further disposed in a sidewall of the mesa.

In some aspects, the techniques described herein relate to a diode, wherein: the diode includes an arrangement of geometrically shaped cells; a widest portion of the drift region excludes the surface region; and a narrowest portion of the drift region includes the surface region.

In some aspects, the techniques described herein relate to a diode, wherein: the first conductivity type is n-type; and the second conductivity type is p-type.

In some aspects, the techniques described herein relate to a diode, wherein: the substrate is a silicon carbide substrate; and the semiconductor layer is an epitaxial silicon carbide layer, the substrate having a doping concentration that is higher than a doping concentration of the epitaxial silicon carbide layer.

In some aspects, the techniques described herein relate to a diode, wherein the semiconductor layer includes: a first epitaxial semiconductor layer of the first conductivity type, the first epitaxial semiconductor layer being disposed on the substrate; and a second epitaxial semiconductor layer of the first conductivity type, the second epitaxial semiconductor layer being disposed on the first epitaxial semiconductor layer, the first epitaxial semiconductor layer having a doping concentration that is greater than a doping concentration of the second epitaxial semiconductor layer.

In some aspects, the techniques described herein relate to a diode, wherein the at least a portion of the shield region is a first portion of the shield region, the diode further including: a metal disposed on a second portion of the shield region and defining an ohmic contact to the shield region.

In some aspects, the techniques described herein relate to a diode, wherein the metal disposed on the second portion of the shield region includes at least one of: the Schottky material; a metal silicide; or a deposited metal.

In some aspects, the techniques described herein relate to a diode, wherein the surface region has a depth in the semiconductor layer of 100 nanometers (nm) or less.

In some aspects, the techniques described herein relate to a diode, wherein the surface region is disposed in ten percent to ninety percent of an area of an upper portion of the drift region.

In some aspects, the techniques described herein relate to a diode, wherein the doping concentration of the surface region varies along at least one of: a surface of the semiconductor layer; or a depth of the surface region in the semiconductor layer.

In some aspects, the techniques described herein relate to a diode, wherein the surface region is further disposed in ten percent to ninety percent of an area of an upper portion of the shield region.

In some aspects, the techniques described herein relate to a diode including: a substrate of a first conductivity type; a semiconductor layer of the first conductivity type disposed on the substrate, the semiconductor layer including a drift region of the diode; a first shield region of a second conductivity type disposed in the semiconductor layer adjacent to the drift region; a second shield region of the second conductivity type disposed in the semiconductor layer adjacent to the drift region, the drift region being disposed, at least in part between the first shield region and the second shield region; a surface region of the first conductivity type disposed in a first portion of the drift region between the first shield region and the second shield region, the surface region having a doping concentration that is greater than a doping concentration of a second portion of the drift region adjacent to the surface region, a second portion of the drift region excluding the surface region; and a Schottky material disposed on: at least a portion of the first shield region; at least a portion of the second shield region; the surface region in the first portion of the drift region; and the second portion of the drift region.

In some aspects, the techniques described herein relate to a diode, wherein the surface region is further disposed: between the first shield region and the second portion of the drift region; and between the second shield region and the second portion of the drift region.

In some aspects, the techniques described herein relate to a diode, wherein the surface region is a first surface region, the diode further including: a second surface region of the first conductivity type disposed in a third portion of the drift region, the second surface region including: a first portion disposed between the first shield region and a first portion of the first surface region; and a second portion disposed between the second shield region and a second portion of the first surface region, the second surface region having a doping concentration that is greater than the doping concentration of the second portion of the drift region and less than the doping concentration of the first surface region, the Schottky material being further disposed on the second surface region.

In some aspects, the techniques described herein relate to a diode, wherein the second portion of the drift region is disposed between the first portion of the first surface region and the second portion of the first surface region.

In some aspects, the techniques described herein relate to a method for forming a diode, the method including: forming a semiconductor layer of a first conductivity type disposed on a substrate of the first conductivity type, the semiconductor layer including a drift region of the diode; forming a shield region of a second conductivity type in the semiconductor layer adjacent to the drift region; forming a surface region of the first conductivity type in a first portion of the drift region adjacent to the shield region, the surface region having a doping concentration that is greater than a doping concentration of a second portion of the drift region adjacent to the surface region, the second portion of the drift region excluding the surface region; and depositing a Schottky material disposed on: at least a portion of the shield region; the surface region in the first portion of the drift region; and the second portion of the drift region.

In some aspects, the techniques described herein relate to a method, wherein the doping concentration of the surface region varies along at least one of: a surface of the semiconductor layer; or a depth of the surface region in the semiconductor layer.

In some aspects, the techniques described herein relate to a method, wherein the surface region is a first surface region, the method further including: forming a second surface region of the first conductivity type in a third portion of the drift region, the second surface region being disposed adjacent to the first surface region, the second surface region having a doping concentration that is greater than the doping concentration of the second portion of the drift region and less than the doping concentration of the first surface region, the Schottky material being further disposed on the second surface region.

BRIEF DESCRIPTION OF THE DRAWINGS

FIG. 10 is a graph illustrating forward voltage drop for the diode implementations illustrated in FIG. 9.

FIG. 11A-11C are diagrams illustrating cross-sectional views of an example method for forming localized surface regions in a Schottky diode.

FIG. 12A-12D are diagrams illustrating cross-sectional views of another example method for forming localized surface regions in a Schottky diode.

FIG. 13A-13C are diagrams illustrating cross-sectional views of yet another example method for forming localized surface regions in a Schottky diode.

Figure 1:
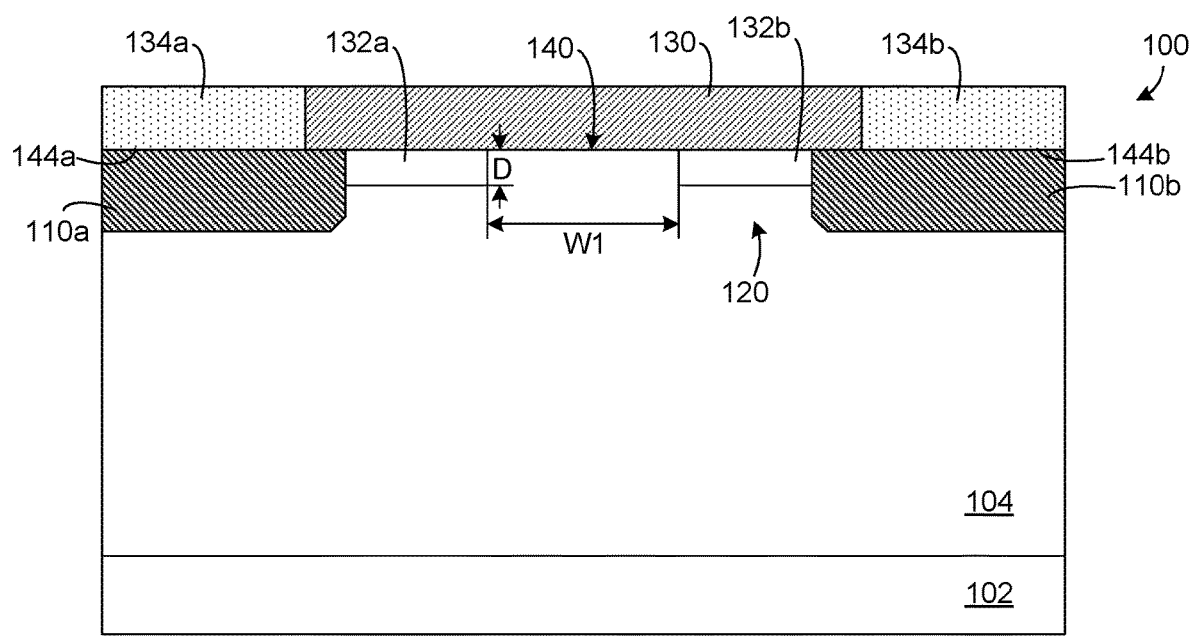
FIG. 1 is a diagram illustrating a cross-sectional view of a Schottky diode including localized surface regions, according to an implementation.

In the drawings, which are not necessarily drawn to scale, like reference symbols may indicate like and/or similar components (elements, structures, etc.) in different views. The drawings illustrate generally, by way of example, but not by way of limitation, various implementations discussed in the present disclosure. Reference symbols show in one drawing may not be repeated for the same, and/or similar elements in related views. Reference symbols that are repeated in multiple drawings may not be specifically discussed with respect to each of those drawings, but are provided for context between related views. Also, not all like elements in the drawings are specifically referenced with a reference symbol when multiple instances of that element are illustrated.

DETAILED DESCRIPTION

The present disclosure is directed to diodes with Schottky contacts (e.g., Schottky diodes), and associated methods of producing such diodes. In the approaches described herein, localized surface regions (e.g., surface regions with a depth of 100 nanometers or less) are used to locally alter areas of a Schottky interface in an underlying semiconductor material (e.g., in an upper portion of a drift region of the diode). That is, such surface regions can be included in a Schottky interface (e.g., Schottky contact) of a diode to locally alter barrier height, and associated electric field of the Schottky interface. In some implementations, such surface regions can be formed by ion implantation, in situ doping, or by using other approaches. By locating the surface regions in portions of the Schottky contact of the diode with lower electric fields, an effective turn-on voltage, or forward voltage drop $V_f$, (thus on-state losses) of the diode can be reduced without significantly impacting reverse blocking capabilities of the diode (e.g., without significantly increasing reverse-biased leakage current). In some implementations, both forward and reverse operating characteristics of a Schottky diode can be improved.

FIG. 1 is a diagram illustrating a cross-sectional view of a Schottky diode 100 (diode) including surface regions (e.g., formed by localized surface implants), according to an implementation. In some implementations, the diode 100 can have a linear (striped) cell layout, (e.g., having identical structure and dimensions into and/or out of the page). In some implementations, the diode 100 can have a cellular layout, such as the example shown in FIG. 5. The diode 100 illustrates a cross-sectional view of a single diode cell perpendicular to the stripe of the linear cell layout, which can be interconnected with other diode stripes or diode cells to form a larger diode (e.g., by electrically connecting the respective anodes together and by electrically connecting the respective cathodes together). Depending on the particular implementation, the spacing, sizing and arrangement of the elements of the diode 100 can be different.

As shown in FIG. 1, the diode 100 includes a substrate 102 and a semiconductor layer 104 (semiconductor region). The substrate 102 and the semiconductor layer 104 can be of a first conductivity type, e.g., n-type conductivity. The substrate 102 can have a doping concentration that is higher than a doping concentration of the semiconductor layer 104. In some implementations, the semiconductor layer 104 can be an epitaxial semiconductor layer, or can include multiple epitaxial semiconductor layers with different doping concentrations. That is, in the view of FIG. 1, the upper portion of the semiconductor layer 104 can have a doping concentration that is higher than a doping concentration of the lower portion of the semiconductor layer 104, or can gradually increase along a depth of the semiconductor layer 104, e.g., depth from an upper surface of the semiconductor layer 104 to a bottom of the semiconductor layer 104. In some implementations, the substrate 102 and the semiconductor layer 104 can include silicon carbide, or other semiconductor materials. In some implementations, n-type doping can be provided by incorporation of nitrogen, phosphorous, etc.

The diode 100 includes a shield region 110a and a shield region 110b that are disposed in the semiconductor layer 104. The shield region 110a and the shield region 110b are disposed adjacent to a drift region 120 of the diode 100. The shield region 110a and the shield region 110b of the diode 100 are of a second conductivity type that is opposite the first conductivity type, e.g., p-type conductivity. In some implementations, the first and second conductivity types can be reversed. In some implementations, p-type doping can be provided by incorporation of aluminum, boron, etc.

The diode 100 also includes a Schottky material 130 that defines a Schottky contact 140 with the drift region 120, e.g., along a surface of the drift region 120 between the shield region 110a and the shield region 110b. In example implementations, the Schottky material 130 can include a metal, an alloy, a semiconductor material, and/or other material that defines a Schottky barrier with the drift region 120. The drift region 120 includes a surface region 132a and a surface region 132b that are disposed in respective first and second upper portions of the drift region 120, and are included in an interface (Schottky interface) of the Schottky contact 140. As shown in FIG. 1, the surface regions 132a and 132b, as well as the other surface regions described herein, can have a depth D. In some implementations, the depth D, as indicated above, can be on the order of 100 nanometers, or less.

The surface regions 132a and 132b, in this example, are of the first conductivity type, and can be formed simultaneously (e.g. using a same implantation process). As shown in FIG. 1, a central (third) upper portion of the drift region 120 along the interface of the Schottky contact 140 excludes a surface region. In this example, the surface regions 132a and 132b have a higher doping concentration than portions of the drift region 120 excluding such implants, such as the central portion.

As shown in FIG. 1, with respect to the interface of the Schottky contact 140, the surface regions 132a 132b are disposed in an respective upper portions (e.g., first and second portions, respectively) of the drift region 120 adjacent to (and in contact with) the shield regions 110a and 110b. A third, central, upper portion of the drift region 120, disposed between the surface regions 132a and 132b, excludes a localized surface implant, e.g., can have the original doping concentration of the semiconductor layer 104.

The surface regions 132a and 132b, in this example, locally alter (lower) a barrier height of the Schottky contact 140, as well as locally alter (increase) associated electric fields in the portions of the drift region 120 including the surface regions 132a and 132b during reverse bias operation. Accordingly, in this example, the Schottky contact 140 corresponding with the central portion of the drift region 120 will have a barrier height that is greater than a barrier height of the respective portions of the Schottky contact 140 corresponding with the surface regions 132a and 132b.

As shown in FIG. 1, the portion of the drift region 120 excluding a surface region (e.g., implant) can have a width W1. In some implementations, the width W1 can be ten percent to ninety percent of a width of the upper portion of the drift region 120 disposed between shield regions 110a, 110b. In other words, the surface regions 132a and 132b can occupy ninety percent to ten percent of the upper portion of the drift region 120. In example implementations, the width W1 can be selected based on electric field distribution at a surface of the drift region 120 (e.g., electric field distribution along the Schottky contact 140 under reverse-bias conditions) to achieve a desired relationship between on-state and off-state operating characteristic of the diode 100. In the following discussion, references to electric field electric field and electric field distribution refer, respectively, to electric field and electric field distribution under reverse-bias conditions, unless otherwise indicated.

In this example, as W1 is varied (widened or narrowed), an associated surface area of the drift region 120 excluding surface regions on which the Schottky material 130 is disposed will vary (will respectively increase or decrease). Likewise, as W1 is varied, respective surface areas of the surface regions 132a and 132b on which the Schottky material 130 is disposed will also correspondingly vary. That is, increasing W1 will reduce the respective surface areas of the surface regions 132a and 132b included in the Schottky contact 140, while decreasing W1 will increase the respective surface areas of the surface regions 132a and 132b included in the Schottky contact 140.

In the diode 100, in the absence of surface regions 132a 132b, electric field distribution in the drift region 120 (e.g., just below, for instance, 5 nanometers or less below, the Schottky contact 140) will be highest at a mid-point between the shield region 110a and the shield region 110b, and will decrease moving away from the mid-point, respectively, toward the shield region 110a and the shield region 110b (e.g., with a bell-shaped curve distribution). Accordingly, if properly designed, the central portion of the drift region 120 excluding surface regions will have the highest electric field for the diode 100, while the surface regions 132a and 132b are disposed in portions of the drift region 120 with originally lower electric field.

In this example, the portion of the Schottky contact 140 corresponding with the portion of the drift region excluding surface regions will have a higher barrier height than a barrier height of the portions of the Schottky contact 140 corresponding with the surface regions 132a and 132b. Accordingly, tradeoff between forward operating characteristics and reverse operating characteristics of the diode 100 can be improved, e.g., as compared to having a uniformly doped surface of the drift region 120 under the Schottky contact 140.

For instance, in some implementations, the diode 100, the width W1 and doping of the surface regions 132a and 132b can be configured such that respective leakage current density (e.g., total leakage through a specific device portion divided by the area of that portion) and/or respective on-state current densities of the portion of the Schottky contact 140 corresponding to the central portion of the drift region, and the portions of the Schottky contacts 140 corresponding with the surface regions 132a and 132b are the same, or substantially the same (e.g., have a same design target). In other implementations the width W1 and the doping of surface regions 132a and 132b can be configured such that leakage current density though the portions of the Schottky contact 140 corresponding with the surface regions 132a and 132b is lower than that a current density through the portion of the Schottky contact 140 corresponding to the central portion of the drift region 120, while the corresponding device still has lower barrier height and lower $V_f$ associated with the higher doped surface regions 132a and 132b. Such implementations can reduce overall leakage current of the diode 100 as compared to having a uniformly, higher doped the Schottky contact 140 to achieve specific forward operating characteristics. Further in the diode 100, the lower barrier height of the Schottky contact 140 associated with the higher doped surface regions 132a and 132b will reduce $V_f$ of the diode 100 (e.g., reduce on-state conduction losses) as compared to a diode having a uniformly, lower doped surface under the Schottky contact 140 to achieve specific reverse operating characteristics. Accordingly, improved tradeoff between on-state operating characteristics and off-state operating state characteristics of a Schottky diode can be achieved by implementations of the diode 100.

As also shown in FIG. 1, the diode 100 includes a metal including a portion 134a and a portion 134b. The portion 134a and the portion 134b form, respectively, an Ohmic contact 144a with the shield region 110a, and an Ohmic contact 144b with the shield region 110b. In some implementations, the portions 134a and 134b can include the Schottky material 130 of the diode 100. In some implementations, the portions 134a and 134b can include a different material, which can be deposited, annealed and/or silicided to form the Ohmic contacts 144a and 144b.

Figure 2:
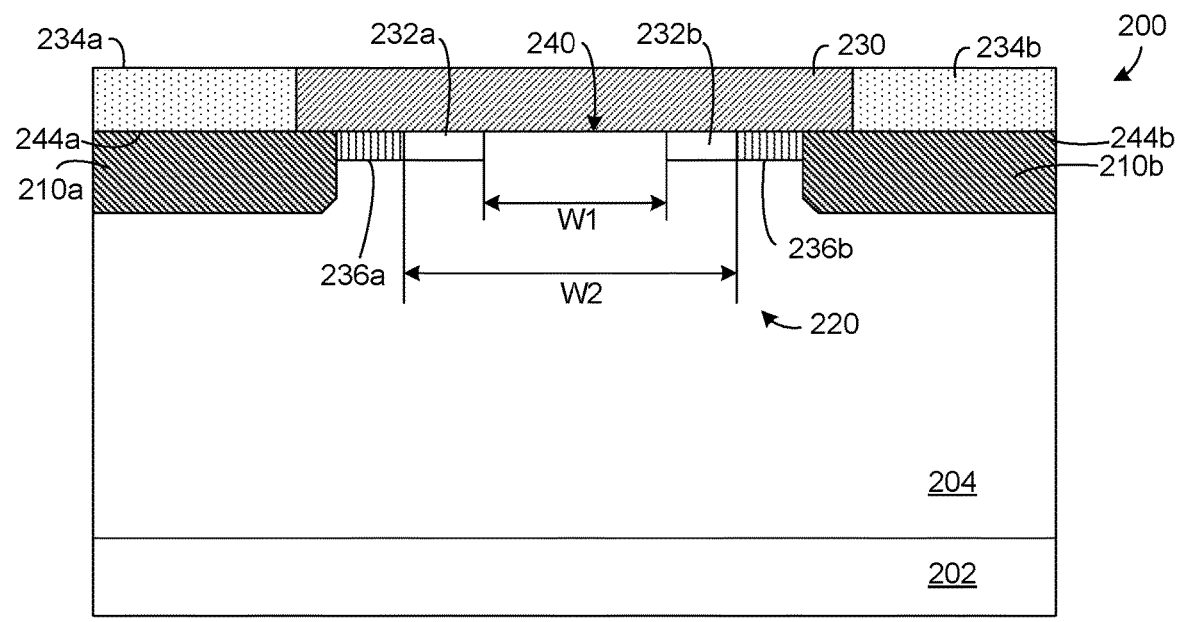
FIG. 2 is a diagram illustrating a cross-sectional view of another Schottky diode including localized surface regions, according to an implementation.

FIG. 2 is a diagram illustrating a cross-sectional view of another diode 200 including higher doped surface regions, according to an implementation. As with the diode 100, in some implementations, the diode 200 can have a linear (stripe) cell layout, i.e., into and/or out of the page. In some implementations, the layout of the diode 200 can be cellular (e.g. utilizing an arrangement of geometric cells, such square, hexagonal, etc. cells), such as the example shown in FIG. 5. The diode 200 illustrates a single diode stripe or a single diode cell, which can be interconnected with other diode stripes or diode cells to form a larger diode. Depending on the particular implementation, the spacing, sizing and arrangement of the elements of the diode 200 can be different.

As shown in FIG. 2, the diode 200 includes a substrate 202 and a semiconductor layer 204 (semiconductor region). The substrate 202 and the semiconductor layer 204 can be of a first conductivity type, e.g., n-type conductivity. The substrate 202 can have a doping concentration that is higher than a doping concentration of the semiconductor layer 204. In some implementations, the semiconductor layer 204 can be an epitaxial semiconductor layer, or can include multiple epitaxial semiconductor layers with different doping concentrations. That is, in the view of FIG. 2, the upper portion of the semiconductor layer 204 can have a doping concentration that is higher than a doping concentration of the lower portion of the semiconductor layer 204, or varies along a depth in the semiconductor layer 204. In some implementations, the substrate 202 and the semiconductor layer 204 can include silicon carbide, or other semiconductor materials.

The diode 200 includes a shield region 210a and a shield region 210b that are disposed in the semiconductor layer 204. The shield region 210a and the shield region 210b are disposed adjacent to a drift region 220 of the diode 200. The shield region 210a and the shield region 210b of the diode 200 are of a second conductivity type that is opposite the first conductivity type, e.g., p-type conductivity. In some implementations, the first and second conductivity types can be reversed.

As with the diode 100, the diode 200 includes a Schottky material 230 (e.g., a Schottky metal layer, or other Schottky material) that defines a Schottky contact 240 with the drift region 220, e.g., along a surface of the drift region 220 between the shield region 210a and the shield region 210b. The drift region 220 includes a surface region 232a (e.g., formed by ion implantation) and a surface region 232b (e.g., formed by ion implantation) that are disposed in respective first and second portions of the drift region 220, which define a Schottky contact 240 with Schottky material 230. The diode further includes a surface region 236a (e.g., a localized surface implant) and a surface region 236b (e.g., a localized surface implant) that are disposed in respective third and fourth portions of the drift region 220, and define the Schottky contact 240 with Schottky material 230.

The surface regions 232a and 232b, in this example, are of the first conductivity type, and can be formed simultaneously using an ion implantation process. The surface regions 236a and 236b are also of the first conductivity type, and can be formed simultaneously using another ion implantation process. In the diode 200, the surface regions 232a and 232b have a higher doping concentration than portions of the drift region 220 excluding such surface regions, such as the central portion, and the surface regions 236a and 236b have a higher doping concentration compared to the doping concentration of the surface regions 232*a* and 232*b*. As shown in FIG. 2, a central (e.g., fifth) portion of the drift region 220 along the interface of the Schottky contact 240 excludes a surface region, e.g., can have an original doping concentration of the semiconductor layer 204.

As shown in FIG. 2, the surface region 232*a* is disposed adjacent to the central upper portion of the drift region 220, and the surface region 232*b* is disposed adjacent to the central upper portion of the drift region 220, e.g., symmetric to the surface region 232*a* with respect to the central upper portion of the drift region 220. Further, the surface region 236*a* is disposed between the shield region 210*a* and the surface region 232*a*, and the surface region 236*b* is disposed between the shield region 210*b* and the surface region 232*b*.

The surface regions 232*a*, 232*b*, 236*a* and 236*b*, in this example, locally, and respectively alter (lower) a barrier height of the Schottky contact 240, as well as locally, and respectively alter (increase) associated electric fields in the portions of the drift region 220 including those surface regions. Accordingly, in this example, the Schottky barrier will be higher at the Schottky interface above the central upper portion of the drift region 220 that excludes a surface regions than a barrier height of the respective portions of the Schottky contact above the portions of the drift region 220 that include the surface regions 232*a*, 232*b*, 236*a* and 236*b*. Further, the Schottky 240 at the interface between the Schottky material 230 and the portions of the drift region including the surface regions 232*a* and 232*b* will have a barrier height that is greater than the barrier height of the Schottky contact at the interface above the portions of the drift region 220 including the surface regions 236*a* and 236*b*. That is, the portion of the Schottky contact 240 corresponding with the central portion of the drift region 220 will have a barrier height that is greater than a barrier height of the respective portions of the Schottky contact 240 corresponding with the surface regions 232*a* and 232*b*. Also, the barrier height of the portions of the Schottky contact 240 corresponding the surface regions 232*a* and 232*b* will be greater than a barrier height of the respective portions of the Schottky contact 240 corresponding with the surface regions 236*a* and 236*b*.

As shown in FIG. 2, the portion of the drift region 220 excluding a surface region (e.g., a localized surface implant) can have a width W1. Further, the portion of the drift region 220 excluding a surface region, together with the portions of the drift region 220 including the surface regions 232*a* and 232, has a width of W2. In example implementations, the widths W1 and W2, and doping concentration of the surface regions 232*a*, 232*b*, a36*a*, 236*b* can be selected based on electric field distribution at a surface of the drift region 220 (e.g., electric field distribution under reverse-bias conditions) to achieve a desired relationship between on-state and off-state operating characteristic of the diode 200.

In this example, as W1 is varied (widened or narrowed), an associated surface area of the drift region 220 excluding a surface region on which the Schottky material 230 is disposed will vary (will respectively increase or decrease). Likewise, as W1 is varied, respective surface areas of the drift region 220 in which the surface regions 232*a*, 232*b*, 236*a* and 236*b* are disposed will also correspondingly vary. That is, increasing W1 will reduce the overall surface area of the drift region 220 in which the surface regions 232*a*, 232*b*, 236*a* and 236*b* are disposed, while decreasing W1 will increase the overall surface areas of the drift region 220 in which the surface regions 232*a*, 232*b*, 236*a* and 236*b* are disposed. Also, as W2 is varied, respective surface areas of the drift region 220 in which the surface regions 236*a* and 236*b* are disposed will also correspondingly vary. That is, increasing W2 will reduce the surface area of the drift region 220 in which the surface regions 236*a* and 236*b* are disposed, while decreasing W2 will increase the surface areas of the drift region 220 in which the surface regions 236*a* and 236*b* are disposed.

In the diode 200, in the absence of regions 232*a*, 232*b*, 236*a* and 236*b*, as with the diode 100, the electric field distribution in the drift region 220 (e.g., just below the Schottky contacts 240) will be highest at a mid-point between the shield region 210*a* and the shield region 210*b*, and will decrease moving away from the mid-point, respectively, toward the shield region 210*a* and the shield region 210*b* (e.g., with a bell-shaped curve distribution). Accordingly, the central portion of the drift region 220 excluding a surface region will have the highest electric field for the diode 200, while the electric field at the upper portion of the drift region 220 including the surface regions 232*a*, 232*b*, 236*a* and 236*b* will be similar, or lower.

In this example, the portion of the Schottky contact 240 corresponding with the portion of the drift region excluding a surface implant will have a higher barrier height than a barrier height of the portions of the Schottky contact 240 corresponding with the surface regions 232*a*, 232*b*, 236*a* and 236*b*. Further, the barrier height of the portions of the Schottky contact 240 corresponding with the surface regions 232*a*, 232*b* will greater than a higher barrier height of the portions of the Schottky contact 240 corresponding with the surface regions 236*a* and 236*b*. Accordingly, a tradeoff between forward operating characteristics and reverse operating characteristics of the diode 200 can be improved, e.g., as compared to having a Schottky contact interface having a constant doping concentration in the upper portion of the drift region.

For instance, in the diode 200, the widths W1 and W2 can be adjusted such that respective leakage current density (e.g., leakage current through a specific device portion divided by a corresponding area) and/or respective on-state current densities of the portion of the Schottky contact 240 corresponding with the central portion of the drift region, and the portions of the Schottky contact 240 corresponding with the surface regions 232*a*, 232*b*, 236*a* and 236*b* are the same, or substantially the same (e.g., have a same design target). Such implementations can reduce overall leakage current of the diode 200 as compared to having a uniformly, higher doped upper portion of the drift layer below the Schottky contact 240 to achieve specific forward operating characteristics. Further in the diode 200, the lower barrier height of the Schottky contact 240 associated with the surface regions 232*a*, 232*b*, 236*a* and 236*b* will reduce $V_f$ of the diode 200 (e.g., reduce on-state conduction losses) as compared to a diode having a uniformly, lower doped upper portion of the drift layer below the Schottky contact 240 to achieve specific reverse operating characteristics. Accordingly, improved tradeoff between on-state operating characteristics and off-state operating state characteristics of a Schottky diode can be achieved by implementations of the diode 200.

As also shown in FIG. 2, the diode 200 includes a metal including a portion 234*a* and a portion 234*b*. The portion 234*a* and the portion 234*b* form, respectively, can define an Ohmic contact 244*a* with the shield region 210*a*, and an Ohmic contact 244*b* with the shield region 210*b*. In some implementations, the portions 234*a* and 234*b* can include the Schottky material 230 of the diode 200. In some implementations, the portions 234*a* and 234*b* can include a different material (e.g., metal, such as Cu, AlCu, etc.), which can be deposited, annealed and/or silicided to form the Ohmic contacts 244a and 244b.

Figure 3:
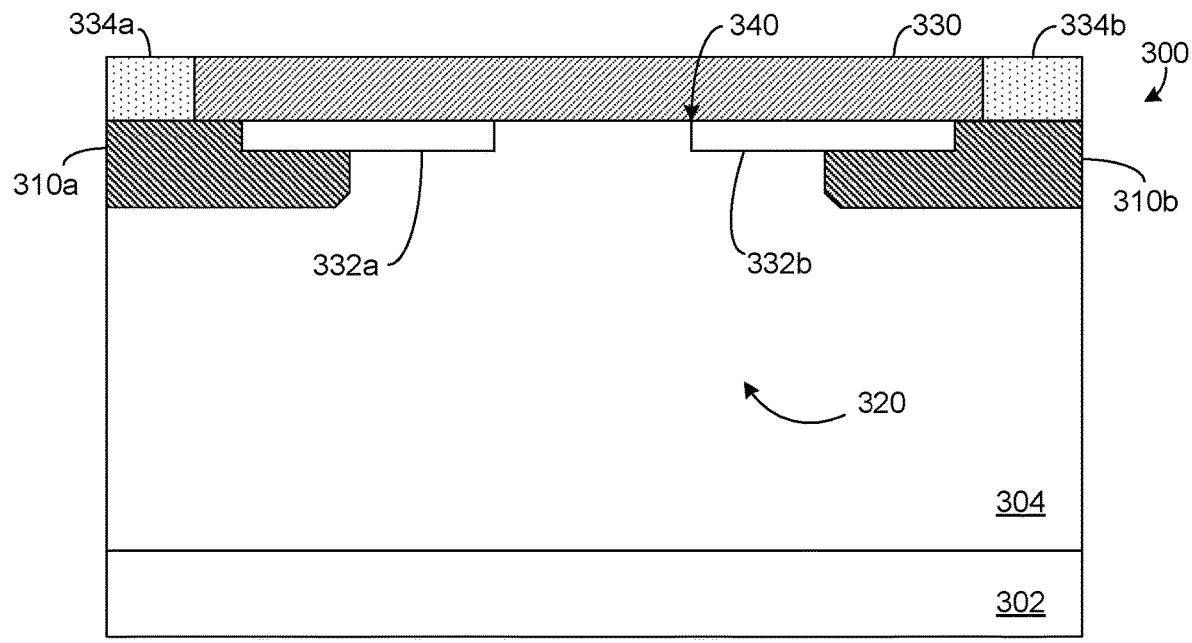
FIG. 3 is a diagram illustrating a cross-sectional view of yet another Schottky diode including localized surface regions, according to an implementation.

FIG. 3 is a diagram illustrating a cross-sectional view of yet another Schottky diode 300 including surface regions, according to an implementation. The diode 300 is a variation of diode 100 in FIG. 1, and includes like and/or similar elements, which are referenced with 300 series reference numbers corresponding with the 100 series reference numbers in FIG. 1. For instance, the diode 300 includes a substrate 302, a semiconductor layer 304, shield regions 310a and 310b, a drift region 320, surface regions 332a and 332b, Schottky material 330, a Schottky contact 340, and metal portions 334a and 334b. For purposes of brevity, the similar aspects and details of the diode 300 with the diode 100 are not discussed again here.

As shown in the FIG. 3, the diode 300 differs from the diode 100 in that the surface regions 332a and 332b extend over respective portions of the shield regions 310a and 310b. In some implementations the surface regions 332a and 332b can extend, respectively, over ten percent to ninety percent of the shield regions 310a and 310b. Such implementations can provide additional improvement in forward conduction characteristics by increasing the overall area of the Schottky contact 340, e.g., as compared to the diode 100, such as for a same active area of the device.

Figure 4:
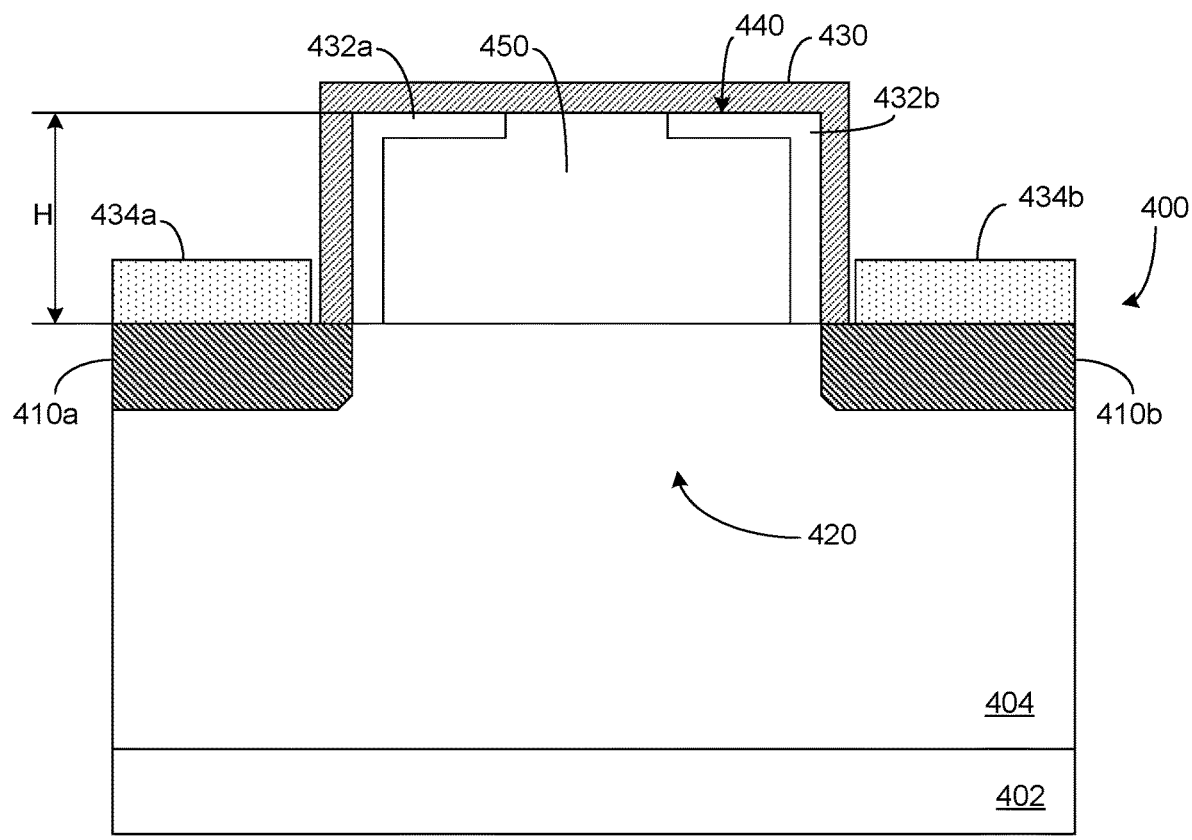
FIG. 4 is a diagram illustrating a cross-sectional view of still another Schottky diode implemented in a semiconductor mesa including localized surface regions, according to an implementation.

FIG. 4 is a diagram illustrating a cross-sectional view of still another Schottky diode 400 including localized drift region implants, according to an implementation. As with the diode 300, the diode 400 is a variation of diode 100 in FIG. 1, and includes like and/or similar elements, which are referenced with 400 series reference numbers corresponding with the 100 series reference numbers in FIG. 1. For instance, the diode 400 includes a substrate 402, a semiconductor layer 404, shield regions 410a and 410b, a drift region 420, surface regions 432a and 432b, Schottky material 430, a Schottky contact 440, and metal portions 434a and 434b. For purposes of brevity, the similar aspects and details of the diode 400 with the diode 100 are not discussed again here.

As shown in the FIG. 4, the diode 400 differs from the diode 400 in that the interface of the Schottky contact 440 is implemented on a mesa 450 of the semiconductor layer 404, where the mesa 450 is included in the drift region 420. Such implementations, as with the diode 300, can improve forward conduction characteristic by increasing area of the associated Schottky interface (e.g., area of the Schottky contact 440).

In some implementations, the mesa 450 can be defined by forming shallow trenches where Ohmic contacts defined by the metal portions 434a and 434b are formed. The shape and dimensions of the mesa 450 in FIG. 4 are shown by way of illustration, and are not necessarily to scale. For instance, the mesa 450 can have a height H, which can 5 microns or less. In the diode 400, additional resistance of the mesa 450 can be compensated for by including the surface regions 432a and 432b on (in, along, etc.) sidewalls of the mesa 450 in addition to portions of the upper surface of the mesa 450.

Figure 5:
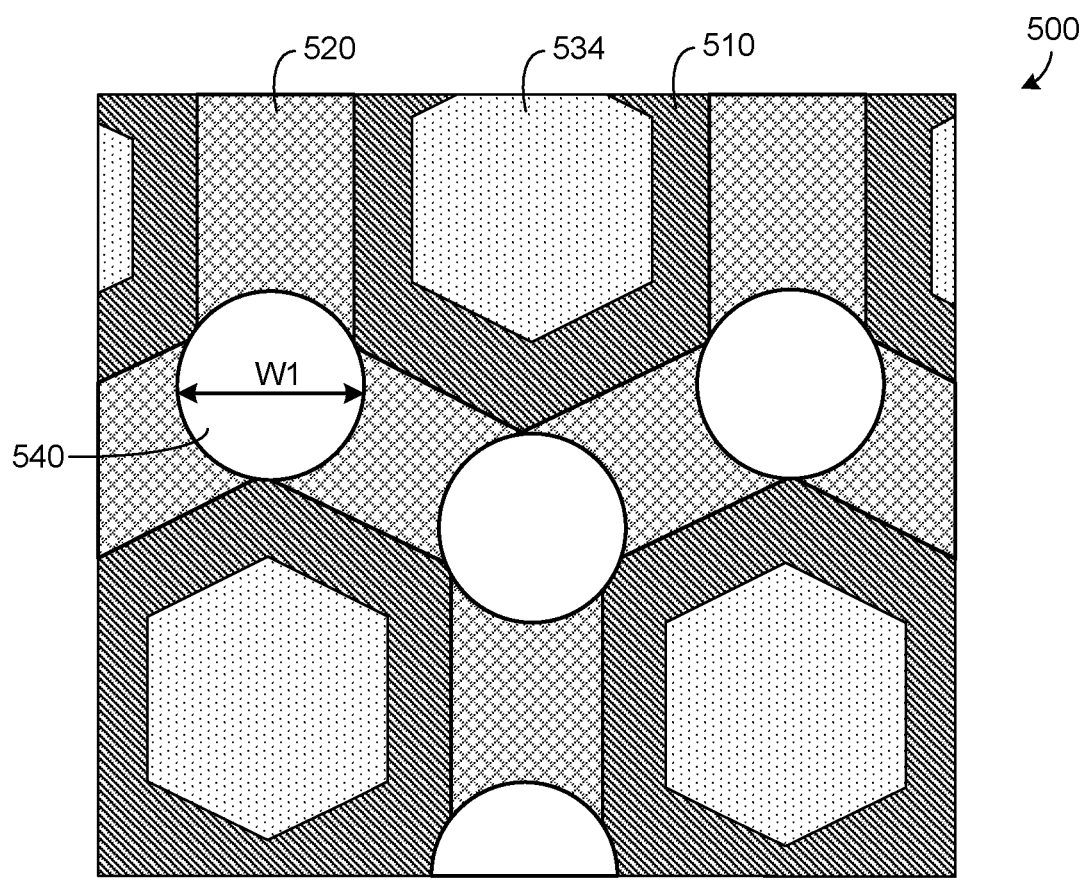
FIG. 5 is a diagram illustrating a top-down (plan) view of still another Schottky diode including localized surface regions, according to an implementation.

FIG. 5 is a diagram illustrating a top-down (plan) view of still another diode 500 including localized surface regions, according to an implementation. The view of the diode 500 shown in FIG. 5 is a portion of a diode having a cellular design. For purposes of illustration, the diode 500 is illustrated without a Schottky material layer and/or metallization layers, e.g., Schottky metal and/or Ohmic contact metal, so as not to obscure the underlying structure.

In the example of FIG. 5, the diode 500 includes hexagon shaped diode cells, where each cell includes a shield region 510, with a drift region 520 of the diode 500 being disposed between the hexagon shaped shield regions, e.g., as segments, streets, etc., having intersections of the drift region 520 between the hexagon shaped shield regions 510. That is, hexagon shaped drift regions surround each shield region 510. In the diode 500, the highest electric field will occur at these intersections of the drift region 520, which are noted as region 540 in FIG. 5, and are the widest portions of the drift region 520. The diode 500 also includes an Ohmic contact region 534 disposed within the shield region 510. In this example, a Schottky material (e.g., metal, alloy, semiconductor material, etc.) can be disposed on, and form a Schottky contact with the drift region 520, including the regions 540. The Schottky material can also be disposed on portions of the shield regions 510, such as in the diodes of FIGS. 1-4. Ohmic contacts, in the Ohmic contact regions 534, can formed using the Schottky material, or another material, such as described herein.

In the diode 500, the segments of the drift region 520 (e.g., the narrower or narrowest portion of the drift region 520) between the regions 540 can include one or more surface regions that can provide desired, respective Schottky barrier heights, such as those described herein, while the regions 540 can exclude such a surface region. Accordingly, the portions of the Schottky contact in the regions 540 will have a barrier height that is greater than portions of the Schottky contact in the areas (segments) of the drift region 520 including the one or more surface regions. A width W1 of the regions 540 (analogous with the width W1 in the diode 100) can be varied to achieve desired operating characteristics of the diode 500. For instance, increasing W1 in the diode 500 will reduce an area of the drift region 520 of the diode 500 is which the one or more surface regions are disposed, while decreasing W1 in the diode 500 will increase an area of the drift region 520 of the diode 500 in which the one or more surface regions are disposed. In some implementations, the width W1 of the regions 540 can be selected such that leakage current density of the regions 540 is the same as, or substantially the same (e.g., has a same design target) as leakage current density of each of the segments of the drift region 520 between each region 540. In some implementations, the width W1 of the regions 540 can be selected such that leakage current density of the regions 540 is lower than leakage current density of each of the segments of the drift region 520 between each region 540

Figure 6:
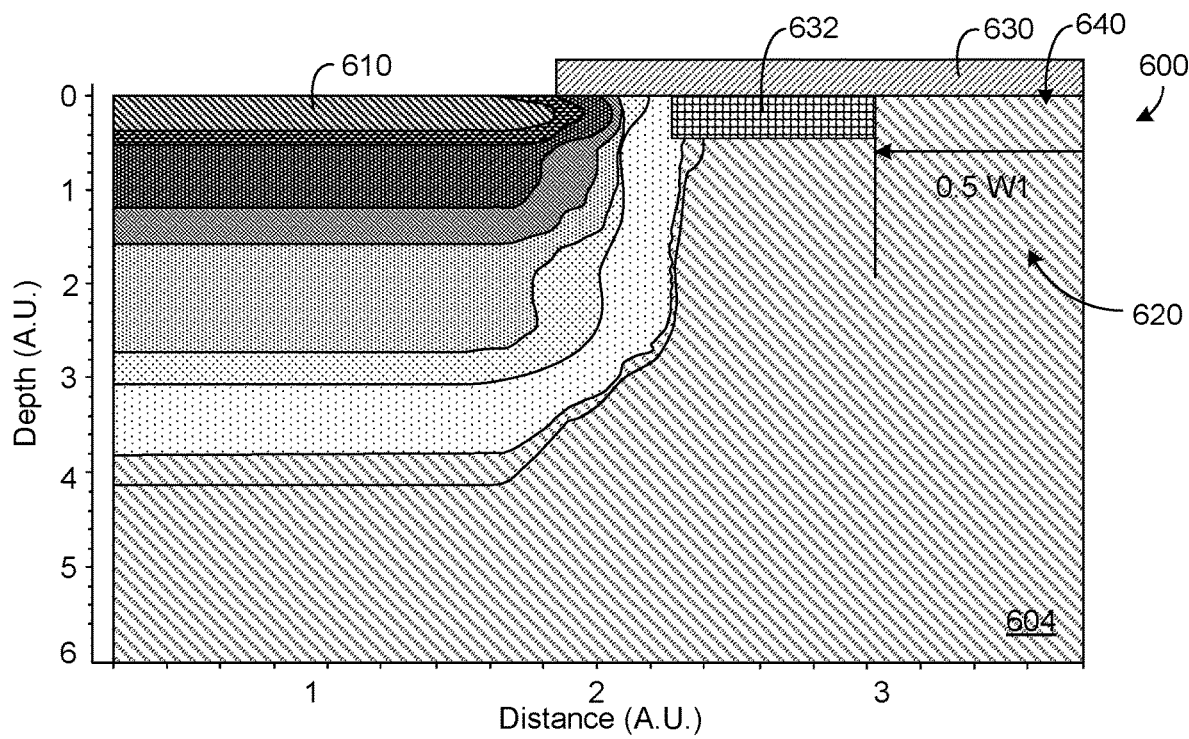
FIG. 6 is a diagram illustrating a cross-sectional view of a half-cell of a Schottky diode (e.g., half a diode cell) including a localized drift region implant, such as the diode of FIG. 1.

FIG. 6 is a diagram illustrating a cross-sectional view of a doping distribution of a diode portion 600 (e.g., half a diode cell having linear/stripe design) including a surface region, such as could be used to implement the diodes described herein. In example implementations, the diode portion 600 can be mirrored on the right and/or left to construct full and/or additional diode stripes or cells.

As shown in FIG. 6, the diode portion 600 includes a semiconductor layer 604 of the first conductivity type (e.g., n-type conductivity) and a shield region 610 of the second conductivity type (e.g., p-type conductivity). In some implementations, these conductivity types can be reversed. A Schottky material 630 is disposed on, and forms a Schottky contact 640 with a drift region 620, and is also disposed on a portion of the shield region 610. The diode portion 600 also includes a surface region 632 that is adjacent to the shield region 610. As shown in FIG. 6, a portion of the drift region 620 excluding the surface region 632 has a width of 0.5 W1, e.g., half the width W1 in FIG. 1, as the diode portion 600 is a half diode segment or cell. As in the diode 100 of FIG. 1, a portion of the Schottky contact 640 corresponding the portion of the drift region 620 excluding the surface region 632 will have a barrier height that is greater than a barrier height of a portion of the Schottky contact corresponding with the surface region 632. Metal defining an Ohmic contact with the shield region 610 is omitted in FIG. 6.

FIG. 6 illustrates relative doping concentrations for both the first conductivity type (e.g., n-type) and the second conductivity type (e.g., p-type) for the diode portion 600. For instance, areas of relative doping concentration for the first conductivity type are indicated for the semiconductor layer 604, including the drift region 620 of the diode portion 600, and for the surface region 632. In this example, areas of relative doping concentration for the second conductivity type are indicated in the shield region 610. In some implementations, the doping concentration of the surface region 632 (e.g., at the interface of the Schottky contact 640) can be to 1000 times higher than the doping concentration of the drift region 620 (e.g., at the interface of the Schottky contact 640 excluding the surface region 632). In this example, doping concentration in the shield region 610 can be higher at the surface of the semiconductor layer 604, and decrease with depth in the semiconductor layer 604. Such doping concentrations will depend on the specific implementation.

In FIG. 6, distance in arbitrary units (A.U.) is shown on the x-axis and depth in A.U. is shown on the y-axis. The distance and depth in FIG. 6 are shown by way of reference, and will vary depending on the particular implementation. In the example of FIG. 6, distance along the x-axis indicates left to right distance along the diode portion 600 and corresponds with distance A.U. for a graph of electric field distribution for implementations of the diode portion 600 shown in FIG. 7 and distance A.U. for the doping concentration profiles of FIG. 8. The depth A.U. in FIG. 6 indicates depth in the semiconductor layer 604, which can be a portion of an epitaxial semiconductor layer, such as those described herein. The depth A.U. in FIG. 6 corresponds with depth A.U. in FIG. 8

FIGS. 7-10 are graphs illustrating various operating characteristics and aspects of implementations of diodes including Schottky contacts with surface regions, such as implementations of the diode 100 of FIG. 1 (e.g., using the diode portion 600). The aspects of FIGS. 7-10 described below can, however, similarly apply to other diodes, such as the example diode implementations described herein.

Figure 7:
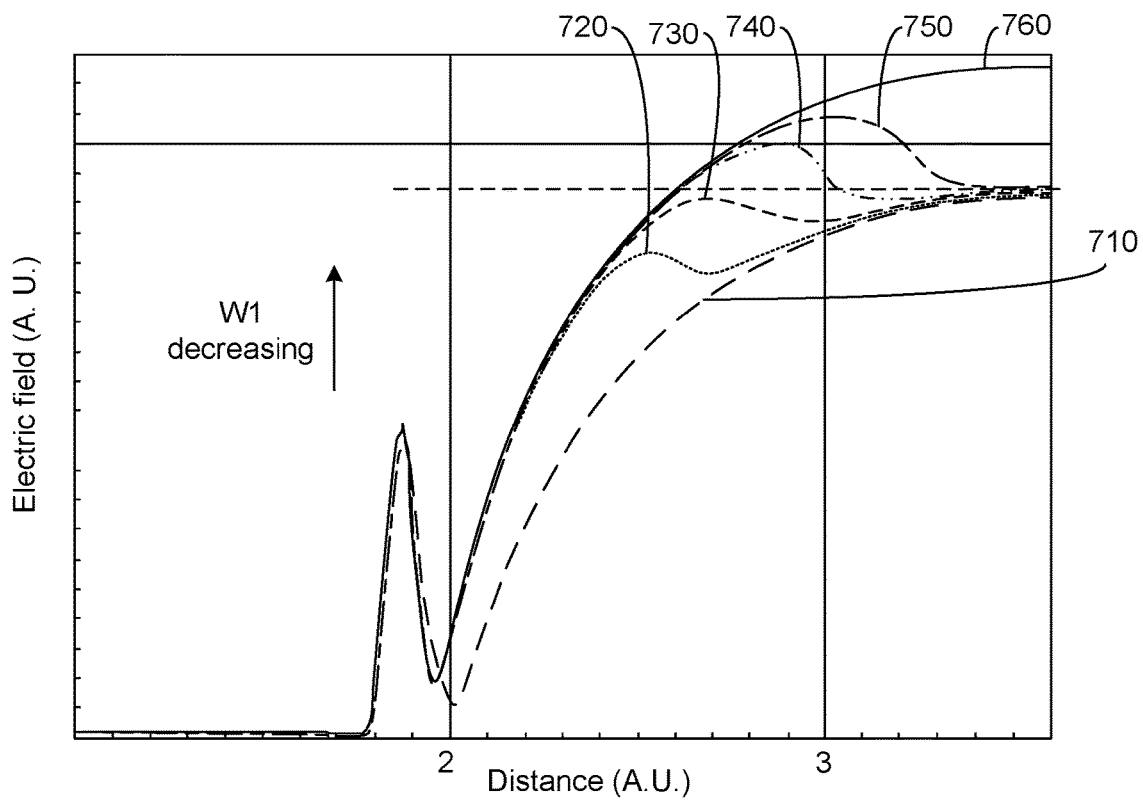
FIG. 7 is a graph illustrating electric fields of various implementations of the diode of FIG. 6 (or FIG. 1) under reverse-bias condition.
Figure 8:
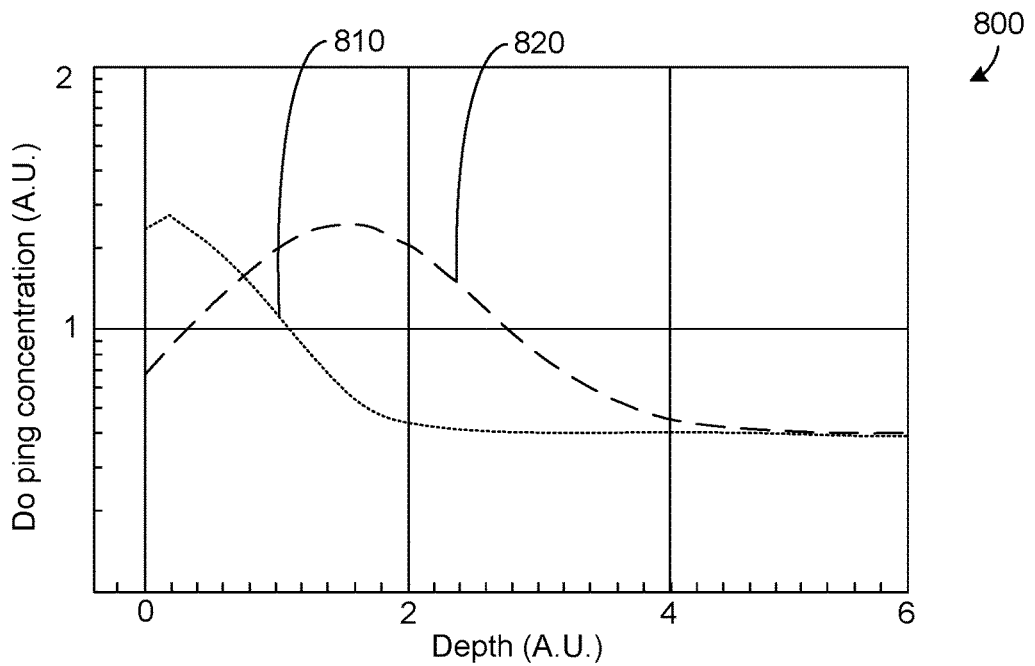
FIG. 8 is a graph illustrating an example of doping concentration of localized surface regions.
Figure 9:
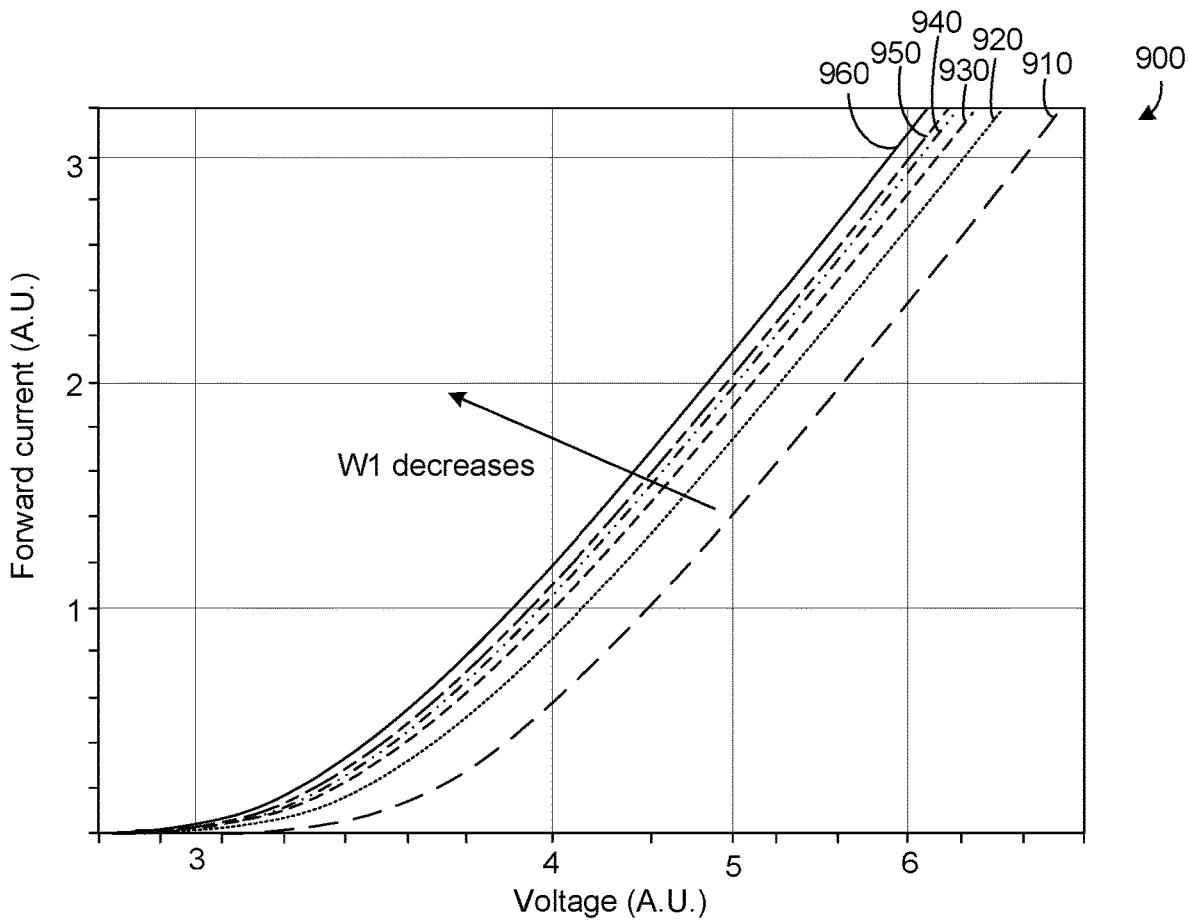
FIG. 9 is graph illustrating forward IV characteristics for implementations of the diode of FIG. 1 compared to a prior diode implementation.

FIG. 7 is a graph 700 illustrating electric field distributions for various implementations of the diode portion 600 of FIG. 6 (or the diode 100 of FIG. 1) under reverse-bias conditions with varying width W1. FIG. 8 is a graph 800 illustrating examples of doping concentrations (e.g., trace 810 and trace 820) versus depth in the surface region (from the Schottky contact interface) for diode implementations with surface regions (e.g., formed using ion implantation). FIG. 9 is graph 900 illustrating IV curves (e.g., forward operating characteristics) for implementations of the diode of FIG. 1, e.g., based on the diode portion 600, compared to a prior diode implementation. FIG. 10 is a graph 1000 illustrating forward voltage drop for diode implementations illustrated in FIG. 9.

Referring to FIG. 7, electric field distributions along a semiconductor surface under a Schottky contact are shown for various implementations of the diode portion 600, with varying width W1, under reverse bias conditions. The applied reverse-bias voltage will vary depending on the particular implementation. In some implementations, the reverse-bias voltage can be 500 volts (V) or greater. The trace 710 illustrates an implementation of a diode with no surface region (e.g., W1 is equal to a width of the drift region bounded by shield regions) and the trace 760 illustrates an implementation of the diode portion 600 where the width W1 is zero (e.g., the entire drift region has a high doping concentration surface region). Traces 720, 730, 740 and 750 illustrate implementations of the diode portion 600, where the width W1 is greater than zero and less than the width of the upper portion of the drift region bounded by the shield regions. The specific values for the width W1 will depend on the particular implementation, such as a width of the diode's drift region. That is, the specific values of the width W1 illustrated by FIG. 7 can be proportional to a width of a corresponding diode's upper portion of the drift region.

The traces 710-760 shown in FIG. 7 illustrate electric fields in the various implementations of the diode portion 600 just below an upper surface of the semiconductor layer 604 (e.g. 5 nm below the upper surface). As noted above, the distance A.U. along the x-axis in FIG. 7 corresponds with the distance A.U. along the x-axis in FIG. 6 for the diode portion 600. Electric field, as a function of distance, is shown on the y-axis in A.U.

As shown by the trace 710, the implementation of a diode with no surface region has the lowest, or similar electric field along the y-direction, which can indicate higher conduction losses than the diode implementations with surface regions illustrated in FIG. 7, e.g., by the traces 720-760. However, the peak 770 of the electric field for the trace 710 can indicate an upper limit for electric field for a given diode structure (e.g., with or without surface regions). Accordingly, the traces 720 and 730 illustrate diodes with surface regions with electric field that is higher at some locations along y-axis than that shown by the trace 710 (e.g., will have lower conduction losses) but do not exceed the peak 770. The electric fields depicted by the traces 740-770 (e.g., at their respective peak electric field) all exceed the peak 770, which could result in high leakage currents and potentially excessive power dissipation during reverse bias operation that can lead to degradation of device characteristics and/or catastrophic failure. Accordingly, such electric field distribution information can be used to select an appropriate value for the width W1 in a corresponding diode implementation, such as the diode 100, where improvement in on-state performance characteristics can be achieved without deterioration of a corresponding diode's reverse/blocking characteristics.

Referring to FIG. 8, the graph 800 illustrates doping concentration profiles for example localized surface implants that can be used in the diode implementations described herein. As noted above, the distance A.U. along the x-axis of FIG. 8 corresponds with the distance A.U. of FIG. 6, and the depth A.U. along the y-axis in FIG. 8 corresponds with the depth A.U. of FIG. 6. In FIG. 8, a trace 810 illustrates a doping concentration distribution for a surface region formed by ion implantation through a film (layer) of another material disposed on a surface of the semiconductor layer or by diffusion methods, and a trace 820 illustrates an example of doping concentration distribution for a surface region formed using ion implantation without such a film on a surface of the semiconductor layer. In implementations such as the example illustrated by the trace 810, the film can be removed after forming the implant. The film can be a screen oxide such as a thermal oxide, a deposited oxide, or could be a layer of another implant screen material. The choice of surface region formation depends on device design specifications and process compatibility.

Referring to FIG. 9, a graph 900 illustrating IV curves (forward operating characteristics) for various Schottky diode implementations, such as implementation of the diode 100 with the diode portion 600, is shown. In the graph 900, voltage (forward voltage) is shown along the x-axis in A.U., and current is shown along the y-axis in A.U. In the graph 900, the trace 910 shows forward IV characteristics for a Schottky diode without surface regions (e.g., the width W1 is equal to a width of the upper portion of the drift region).

In FIG. 9, traces 920, 930, 940, 950 and 960 illustrate forward operating characteristics (IV characteristics) for implementations of the diode 100, where the width W1 is less than a width of the upper portion of the drift region, and as the width W1 decreases for different designs (as indicated in FIG. 9) and the area of the drift region 120 in which the surface regions 132a and 132b are disposed increases. The diode implementations illustrated by the traces 910-960, in this example, can correspond with the diode implementations illustrated by the traces 710-760 in FIG. 7. As shown in FIG. 9, as W1 decreases, current for a given forward voltage increases, illustrating the benefit of the approaches described here of using surface regions in a Schottky diode's drift region for improving the tradeoff between forward operating characteristics and reverse operating characteristics.

Referring to FIG. 10, a graph 1000 illustrating the dependence of forward voltage drop V f (at a fixed forward current density) on the width W1 for implementations of the diode 100, such as those that can correspond with illustrated by the traces 920-960 in FIG. 9 is shown. In FIG. 10, the width W1 is shown along the x-axis in A.U., while corresponding $V_f$ values are shown on the y-axis in A.U. As shown in FIG. 10, as W1 decreases, $V_f$ also decreases. In the graph 1000, in this example, the points 1020 and 1030 correspond respectively with the traces 720 and 730 in FIG. 7, and traces 920 and 930 in FIG. 9. In this example, the point 1020 can represent approximately e.g., a four percent reduction in $V_f$ as compared to the diode implementation illustrated by the trace 910 (e.g., a diode that does not include surface regions), while the point 1030 can represent approximately e.g., an eight percent reduction in $V_f$ as compared to the diode implementation illustrated by the trace 910. Such reductions in $V_f$ can allow for reducing an overall size of a Schottky diode to achieve a desired forward operation current density, which can reduce overall manufacturing costs.

FIG. 11A-11C are diagrams illustrating cross-sectional views of an example method for forming surface regions in a Schottky diode. For purposes of illustration, the approach of FIGS. 11A-11C will be described with reference to the structure of the diode portion 600 in FIG. 6. Referring to FIG. 11A, a mask 1115 can be formed on a surface of the semiconductor layer 604. After forming the mask 1115, a deep, high energy implant (e.g., p-type implant) can be performed to form the shield region 610. The mask 1115 can then be removed and an implant mask 1125 can be formed, where the mask 1125 can be used for forming a localized surface (drift region) implant 1132 (which can correspond with implant 632 in FIG. 6). The implant mask 1125 can then be removed and the Schottky material 630 and/or metal 634 can be formed to define Schottky and Ohmic contacts. In some implementations, the mask 1125 can be formed from mask 1115, e.g., using self-aligned techniques, such as an etch-back process and/or a spacer process.

FIG. 12A-12D are diagrams illustrating cross-sectional views of another example method for forming surface regions in a Schottky diode. As with FIGS. 11A-11C, for purposes of illustration, the approach of FIGS. 12A-12D will be described with reference to the structures of the diode 300 in FIG. 3 and the diode portion 600 in FIG. 6. Referring to FIG. 12A, a mask 1215 can be formed on a surface of the 604. After forming the mask 1215, a deep, high energy implant (e.g., p-type implant) can be performed to form a buried portion 610a of the shield region 610. The mask 1215 can then be removed and a mask 1225 can be formed, where the mask 1225 can be used for forming a localized surface (drift region) implant 1232 (which can correspond with surface regions 332a and 332 in FIG. 3, extending, respectively over the shield regions 310a and 310a, or the shield region 610 in FIG. 6). The mask 1225 can then be removed and the mask 1235 can be formed, where the mask 1235 can be used for forming an upper portion 610b of the shield region 610 The mask 1225 can then be removed and the Schottky metal 630 and/or metal 634 can be formed to define Schottky and Ohmic contacts. In this example, the mask 1225 and/or the mask 1235 can be formed using self-aligned semiconductor processes. For instance, in some implementations, the mask 1225 can be formed from mask 1215, e.g. using an etch-back process. Also, in some implementations, the mask 1235 can be formed from the mask 1225 e.g., using a spacer process.

FIG. 13A-13C are diagrams illustrating cross-sectional views of yet another example method approach for forming surface regions in a Schottky diode. As with FIGS. 11A-11C and 12A-12D, for purposes of illustration, the approach of FIGS. 13A-13C will be described with reference to the structure of the diode portion 600 in FIG. 6. Referring to FIG. 13A, a mask 1315 can be formed on a surface of the semiconductor layer 604. After forming the mask 1315, a deep, high energy implant (e.g., p-type implant) can be performed to form the shield region 610. The implant mask 1315 can then be removed and a mask 1325 can be formed, where the mask 1325 can be a sloped mask and can be used for forming a surface region 1332 where the doping concentration of the implant 1332 can gradually vary along the surface and/or along a depth of the implant 1332 in the semiconductor layer 604. The implant mask 1325 can then be removed, and the Schottky metal 630 and/or metal 634 can be formed to define Schottky and Ohmic contacts. In some implementations, the mask 1325 can be formed using a photoresist reflow process and/or a gray scale photolithography process.

In the approaches described herein, such as in the processing approaches of FIGS. 11A-11C, 12A-12D and 13A-13, surface regions can be formed using an ion implantation with an implantation beam energy of 50 keV or less and an implant dose (e.g., p-type dose) of $1\times10^{12}$ $cm^{-2}$ to $1\times10^{14}$ $cm^{-2}$. In some implementation, different beam energies, implant doses, masking techniques, doping techniques (e.g., diffusion), and so forth can be used. The specific beam energy and dose used can depend, at least in part, on the semiconductor material used, e.g., silicon, SiC, etc.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can refer to regions that are laterally adjacent to or horizontally adjacent to one another, e.g., in contact with, such as in a semiconductor material, semiconductor layer, and/or semiconductor region.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments.

What is claimed is:

1. A diode comprising:
    a substrate of a first conductivity type;
    a semiconductor layer of the first conductivity type disposed on the substrate, the semiconductor layer including a drift region of the diode;
    a shield region of a second conductivity type disposed in the semiconductor layer adjacent to the drift region;
    a surface region of the first conductivity type disposed in a first portion of the drift region adjacent to the shield region, the surface region having a doping concentration that is greater than a doping concentration of a second portion of the drift region adjacent to the surface region, the second portion of the drift region excluding the surface region, the surface region being further disposed in ten percent to ninety percent of an area of an upper portion of the shield region; and
    a Schottky material disposed on:
        at least a portion of the shield region;
        the surface region in the first portion of the drift region; and
        the second portion of the drift region.

2. The diode of claim 1, wherein the surface region is disposed between the shield region and the second portion of the drift region.

3. The diode of claim 1, wherein the surface region is a first surface region, the diode further comprising:
    a second surface region of the first conductivity type disposed in a third portion of the drift region, the second surface region being disposed adjacent to the first surface region, the second surface region having a doping concentration that is greater than the doping concentration of the second portion of the drift region and less than the doping concentration of the first surface region,
    the Schottky material being further disposed on the second surface region.

4. The diode of claim 3, wherein the second surface region is further disposed between the first surface region and the second portion of the drift region.

5. The diode of claim 1, wherein:
    the diode includes an arrangement of geometrically shaped cells;
    a widest portion of the drift region excludes the surface region; and
    a narrowest portion of the drift region includes the surface region.

6. The diode of claim 1, wherein:
    the first conductivity type is n-type; and
    the second conductivity type is p-type.

7. The diode of claim 1, wherein:
    the substrate is a silicon carbide substrate; and
    the semiconductor layer is an epitaxial silicon carbide layer,
    the substrate having a doping concentration that is higher than a doping concentration of the epitaxial silicon carbide layer.

8. The diode of claim 1, wherein the semiconductor layer includes:
    a first epitaxial semiconductor layer of the first conductivity type, the first epitaxial semiconductor layer being disposed on the substrate; and
    a second epitaxial semiconductor layer of the first conductivity type, the second epitaxial semiconductor layer being disposed on the first epitaxial semiconductor layer,
    the first epitaxial semiconductor layer having a doping concentration that is greater than a doping concentration of the second epitaxial semiconductor layer.

9. The diode of claim 1, wherein the at least a portion of the shield region is a first portion of the shield region, the diode further comprising:
    a metal disposed on a second portion of the shield region and defining an ohmic contact to the shield region.

10. The diode of claim 9, wherein the metal disposed on the second portion of the shield region includes at least one of:
    the Schottky material;
    a metal silicide; or
    a deposited metal.

11. The diode of claim 1, wherein the surface region has a depth in the semiconductor layer of 100 nanometers (nm) or less.

12. The diode of claim 1, wherein the surface region is disposed in ten percent to ninety percent of an area of an upper portion of the drift region.

13. The diode of claim 1, wherein the doping concentration of the surface region varies along at least one of:

a surface of the semiconductor layer; or a depth of the surface region in the semiconductor layer.

14. A diode comprising:

a substrate of a first conductivity type;

a semiconductor layer of the first conductivity type disposed on the substrate, the semiconductor layer including a drift region of the diode;

a first shield region of a second conductivity type disposed in the semiconductor layer adjacent to the drift region;

a second shield region of the second conductivity type disposed in the semiconductor layer adjacent to the drift region, the drift region being disposed, at least in part between the first shield region and the second shield region;

a surface region of the first conductivity type disposed in a first portion of the drift region between the first shield region and the second shield region, the surface region having a doping concentration that is greater than a doping concentration of a second portion of the drift region adjacent to the surface region, a second portion of the drift region excluding the surface region, the surface region being further disposed in ten percent to ninety percent of an area of an upper portion of the first shield region and in ten percent to ninety percent of an area of an upper portion of the second shield region; and a Schottky material disposed on:

at least a portion of the first shield region;

at least a portion of the second shield region;

the surface region in the first portion of the drift region; and the second portion of the drift region.

15. The diode of claim 14, wherein the surface region is further disposed:

between the first shield region and the second portion of the drift region; and between the second shield region and the second portion of the drift region.

16. The diode of claim 14, wherein the surface region is a first surface region, the diode further comprising:

a second surface region of the first conductivity type disposed in a third portion of the drift region, the second surface region including:

a first portion disposed between the first shield region and a first portion of the first surface region; and a second portion disposed between the second shield region and a second portion of the first surface region, the second surface region having a doping concentration that is greater than the doping concentration of the second portion of the drift region and less than the doping concentration of the first surface region, the Schottky material being further disposed on the second surface region.

17. The diode of claim 16, wherein the second portion of the drift region is disposed between the first portion of the first surface region and the second portion of the first surface region.

18. A method for forming a diode, the method comprising:

forming a semiconductor layer of a first conductivity type disposed on a substrate of the first conductivity type, the semiconductor layer including a drift region of the diode;

forming a shield region of a second conductivity type in the semiconductor layer adjacent to the drift region;

forming a surface region of the first conductivity type in a first portion of the drift region adjacent to the shield region and in ten percent to ninety percent of an area of an upper portion of the shield region, the surface region having a doping concentration that is greater than a doping concentration of a second portion of the drift region adjacent to the surface region, the second portion of the drift region excluding the surface region; and depositing a Schottky material disposed on:

at least a portion of the shield region;

the surface region in the first portion of the drift region; and the second portion of the drift region.

19. The method of claim 18, wherein the doping concentration of the surface region varies along at least one of:

a surface of the semiconductor layer; or a depth of the surface region in the semiconductor layer.

20. The method of claim 18, wherein the surface region is a first surface region, the method further comprising:

forming a second surface region of the first conductivity type in a third portion of the drift region, the second surface region being disposed adjacent to the first surface region, the second surface region having a doping concentration that is greater than the doping concentration of the second portion of the drift region and less than the doping concentration of the first surface region, the Schottky material being further disposed on the second surface region.

\* \* \* \* \*